US012009827B2

(12) United States Patent
Shen et al.

(10) Patent No.: US 12,009,827 B2
(45) Date of Patent: Jun. 11, 2024

(54) MONITOR CIRCUITRY FOR POWER MANAGEMENT AND TRANSISTOR AGING TRACKING

(71) Applicant: Intel Corporation, Santa Clara, CA (US)

(72) Inventors: Kuan-Yueh Shen, Portland, OR (US); Nasser A. Kurd, Portland, OR (US); John Fallin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/698,844

(22) Filed: Mar. 18, 2022

(65) Prior Publication Data

US 2022/0209778 A1 Jun. 30, 2022

Related U.S. Application Data

(62) Division of application No. 16/913,933, filed on Jun. 26, 2020, now Pat. No. 11,309,900.

(51) Int. Cl.
*H03L 7/099* (2006.01)
*H01R 13/66* (2006.01)
*H03L 7/089* (2006.01)
*H03L 7/189* (2006.01)

(52) U.S. Cl.
CPC ......... *H03L 7/0992* (2013.01); *H01R 13/665* (2013.01); *H03L 7/0893* (2013.01); *H03L 7/189* (2013.01); *H01R 2201/06* (2013.01)

(58) Field of Classification Search
CPC ..... H03L 7/099; H03L 7/0991; H03L 7/0992; H03L 7/0814; H03L 7/0816; H03L 7/07; H03L 1/1022; H03L 7/093; H03L 7/189; H03L 7/191; H03L 7/0893
See application file for complete search history.

(56) References Cited

U.S. PATENT DOCUMENTS

| 6,674,331 B2 | 1/2004 | Mcdowell |
| 11,309,900 B2 * | 4/2022 | Shen ..................... H03L 7/1075 |
| 2021/0409028 A1 | 12/2021 | Shen et al. |

FOREIGN PATENT DOCUMENTS

| CN | 113848446 | 12/2021 |
| DE | 102020134339 | 12/2021 |
| TW | 202201906 | 1/2022 |

OTHER PUBLICATIONS

"U.S. Appl. No. 16/913,933, Restriction Requirement dated Apr. 30, 2021", 5 pgs.

(Continued)

*Primary Examiner* — Hai L Nguyen
(74) *Attorney, Agent, or Firm* — Schwegman Lundberg & Woessner

(57) ABSTRACT

Some embodiments include apparatuses having a first path in a phase locked loop, the first path including a phase frequency detector to receive a first signal having a first frequency and a first node to provide a voltage; an oscillator coupled to a second node and the first node to provide a second signal having a second frequency at the second node; a second path including a frequency divider coupled to the second node and the phase frequency detector; and a circuit to generate digital information having a value based on a value of the voltage at the second node.

11 Claims, 10 Drawing Sheets

(56) References Cited

OTHER PUBLICATIONS

"U.S. Appl. No. 16/913,933, Response filed Jun. 30, 2021 to Restriction Requirement dated Apr. 30, 2021", 8 pgs.
"U.S. Appl. No. 16/913,933, Non Final Office Action dated Jul. 26, 2021", 7 pgs.
"U.S. Appl. No. 16/913,933, Response filed Oct. 26, 2021 to Non Final Office Action dated Jul. 26, 2021", 7 pgs.
"U.S. Appl. No. 16/913,933, Notice of Allowance dated Dec. 15, 2021", 9 pgs.
Farjad-Rad, R., "A low-power Multiplying DLL for Low-Jitter Multigigahertz Clock Generation in Highly Integrated Digital IChips", IEEE Journal of Solid-state circuits, vol. 37(12), (Dec. 2002), 1804-1812.
Razavi, B, "Design of Analog CMOS Integrated Circuits", Ch. 11, McGraw-Hill, (2002), 30 pgs.
Semeraro, G, "Energy-efficient processor design using multiple clock domains with dynamic voltage and frequency scaling", IEEE HPCA, (2002), 12 pgs.
Shen, Kuan-Yueh James, "A 0.17-to-3.5mW 0.15-to-5GHz SoC PLL with 15dB Built-In Supply Noise Rejection and Self-Bandwidth Control in 14nm CMOS", 2016 IEEE International Solid-State Circuits Conference, (2016), 3 pgs.
Singh, T, "3.2 Zen: A next-generation high-performance x86 core", IEEE ISSCC, (2017), 3 pgs.
U.S. Appl. No. 16/913,933 U.S. Pat. No. 11,309,900, filed Jun. 26, 2020, Monitor Circuitry for Power Management and Transistor Aging Tracking.

* cited by examiner

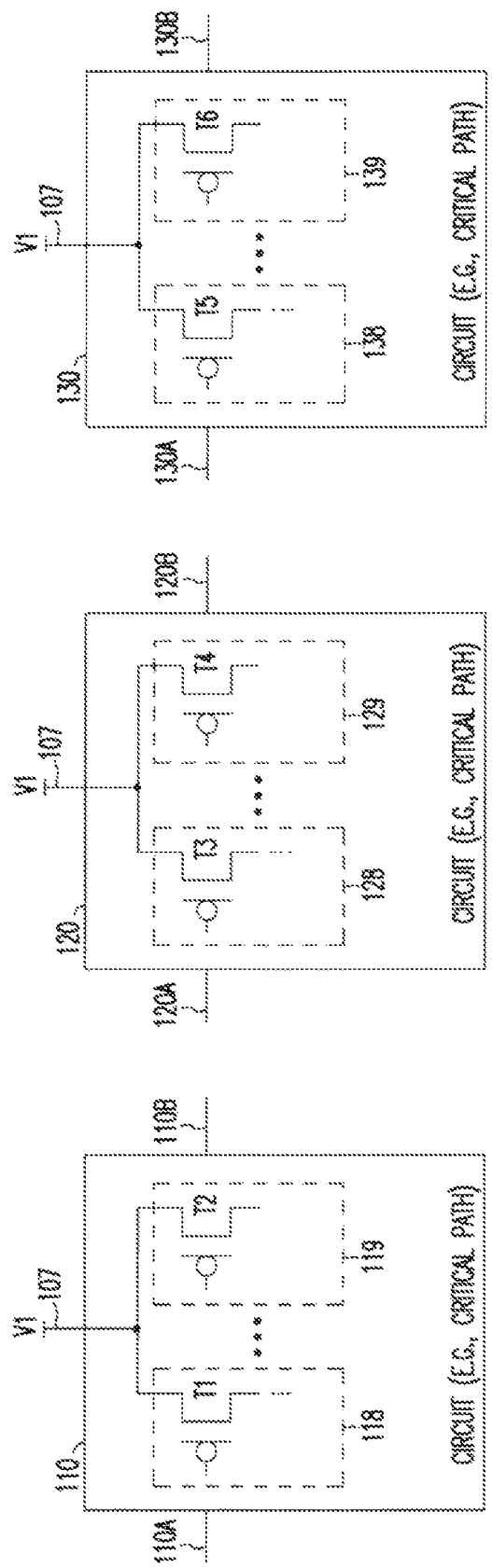

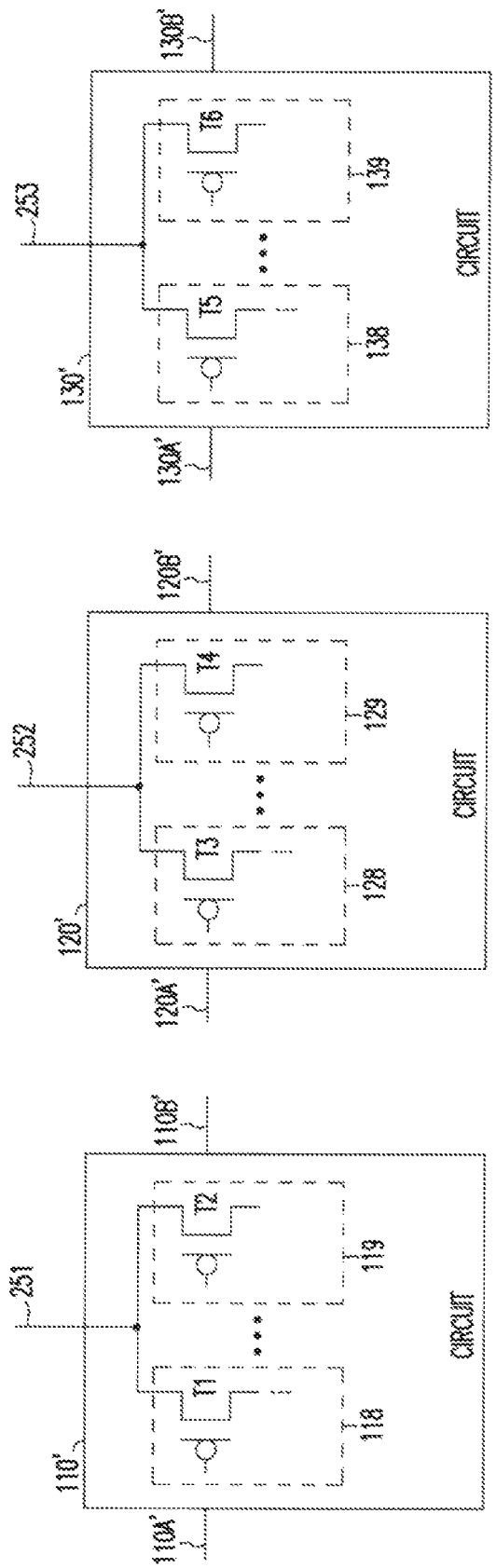

MONITOR CIRCUITRY FOR POWER MANAGEMENT AND TRANSISTOR AGING TRACKING

This application is a divisional of U.S. patent application Ser. No. 16/913,933, filed Jun. 26, 2020, now issued as U.S. Pat. No. 11,309,900, which is incorporated herein by reference in its entirety.

FIELD

Embodiments described herein relate to power management in integrated circuits.

BACKGROUND

Integrated circuit (IC) devices such as processors reside in many computers and electronic items. Some IC devices (e.g., processors) have power management techniques (e.g., dynamic voltage and frequency scaling or DVFS) that can adjust supply voltage and operating frequency on-demand. The value of supply voltage for a given target frequency can be impacted by variations in process, temperature, and aging of transistors in the device. Thus, in some of these devices, providing a feasible way for both power management and monitoring the aging can pose a challenge.

BRIEF DESCRIPTION OF THE DRAWINGS

FIG. 1B, FIG. 1C, and FIG. 1D show more details of circuits of the processing circuitry of the device FIG. 1A, according to some embodiments described herein.

FIG. 2C, FIG. 2D, and FIG. 2E show more details of the replicas in the circuits of FIG. 2B, according to some embodiments described herein.

DETAILED DESCRIPTION

The techniques described herein include a device having a relatively compact on-die, low-power monitor circuitry that can operate to check through a set of candidates, which can represent critical (delay) paths in the device. The monitor circuitry can generate information (e.g., a code) that can be used to establish a real-time, worst case (among the candidates) correlation of a minimum voltage value (e.g., $V_{MIN}$) and operating frequency of circuitry (e.g., processor core) in the device. The information (e.g., the code) generated by the monitor circuitry can also be used to track (or monitor) the minimum voltage value over time to determine aging of circuit elements (e.g., transistors) in the device. The techniques described herein can allow the device to dynamically adjust the value of supply voltage in the device to improve (e.g., reduce) power consumption. The techniques described herein can allow the device to proactively monitor transistor aging to further improve power management in the device. Other improvements and benefits are discussed below with reference to FIG. 1A through FIG. 5.

Figure 1A:
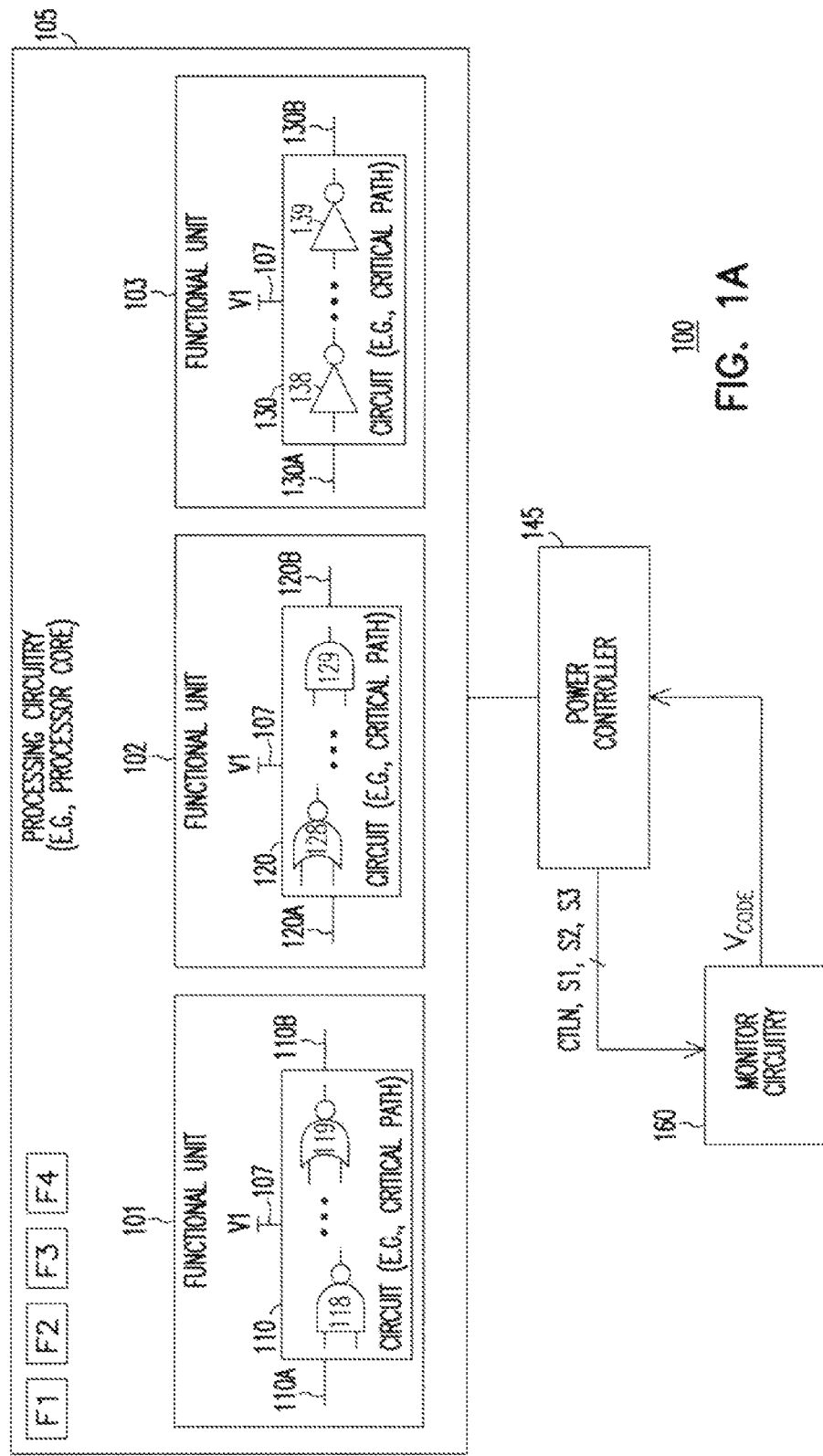
FIG. 1A shows an apparatus in the form of a device having processing circuitry, a power controller, and monitor circuitry, according to some embodiments described herein.

FIG. 1A shows an apparatus in the form of a device 100 having processing circuitry 105, power controller 145, and monitor circuitry 160, according to some embodiments described herein. Device 100 can include a die (e.g., semiconductor die) where processing circuitry 105, power controller 145, and monitor circuitry 160 can be located (e.g., included) in the same die (located on the same IC chip).

Device 100 can be a processing circuitry of any type of architecture, for example, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), hybrid architecture, and other architectures. Device 100 can also be a memory device, a memory controller, a graphics controller, or other types of integrated circuits.

In FIG. 1A, processing circuitry 105 can be a processing core of a processor (e.g., processing core of a central processing unit (CPU)). As shown in FIG. 1A, processing circuitry 105 can include functional units 101, 102, and 103. Each of functional units 101, 102, and 103 can include circuitry to perform a specific function. For example, one or more of functional units 101, 102, and 103 can include calculating circuitry to perform arithmetic functions (e.g., addition, subtraction, and multiplication), data transmission circuitry to perform data transmission functions (e.g., data multiplexing, data de-multiplexing, encoding, decoding), and other types of circuitry (e.g., circuitry in a CPU) to perform other functions (e.g., other functions in a CPU). Circuitry in functional units 101, 102, and 103 can include at least one circuit path (e.g., logic circuit path) that can include logic gates (e.g., inverters, NAND gates, NOR gates, and other logic gates). The circuit paths can include combinational logic circuits or other types of logic circuits.

As shown in FIG. 1A, functional units 101, 102, and 103 can includes circuits 110, 120, and 130, respectively. Each of circuits 110, 120, and 130 can be included in circuitry (e.g., calculating circuitry, data transmission circuitry, and other types of circuitry) of a respective functional unit among functional units 101, 102, and 103.

As shown in FIG. 1A, circuit 110 can include logic gates (e.g., NAND and NOR gates) 118 and 119 that can be part of a logic circuit path between nodes 110A and 110B. The logic circuit path can be part of a critical delay combinational logic path. Nodes 110A and 110B can be input and output nodes, respectively, of circuit 110. FIG. 1A shows circuit 110 including logic gates 118 and 119 as an example. However, circuit 110 can include other circuit elements (e.g., other logic gates). Also for simplicity, FIG. 1A does not show specific number of circuit elements and specific connections among the circuit elements in circuit 110. Circuit 110 may have a time delay (e.g., propagation delay) from node 110A to node 110B. This time delay can be a longest (e.g., maximum) time delay relative to other time delays of other circuit paths (not shown) of functional unit 101. As example, circuit 110 can be a critical path of potential longest time delay in comparisons with other circuit paths in functional unit 101.

As shown in FIG. 1A, circuit 120 can include logic gates (e.g., NOR and AND gates) 128 and 129 that can be part of a logic circuit path between nodes 120A and 120B. The logic circuit path can be part of a combinational logic path. Nodes 120A and 120B can be input and output nodes, respectively, of circuit 120. FIG. 1A shows circuit 120 including logic gates 128 and 129 as an example. However, circuit 120 can include other circuit elements (e.g., other logic gates). Also for simplicity, FIG. 1A does not show specific number of circuit elements and specific connections among the circuit elements in circuit 120. Circuit 120 may have a time delay (e.g., propagation delay) from node 120A to node 120B. This time delay can be a longest (e.g., maximum) time delay relative to other time delays of other circuit paths (not shown) of functional unit 102. As example, circuit 120 can be a critical path of potential longest time delay in comparisons with other circuit paths in functional unit 102.

As shown in FIG. 1A, circuit 130 can include logic gates (e.g., inverters) 138 and 139 that can be part of a logic circuit path between nodes 130A and 130B. The logic circuit path can be part of a combinational logic path. Nodes 130A and 130B can be input and output nodes, respectively, of circuit 130. FIG. 1A shows circuit 130 including logic gates 138 and 139 as an example. However, circuit 130 can include other circuit elements (e.g., other logic gates). Also for simplicity, FIG. 1A does not show specific number of circuit elements and specific connections among the circuit elements in circuit 130. Circuit 130 may have a time delay (e.g., propagation delay) from node 130A to node 130B. This time delay can be a longest (e.g., maximum) time delay relative to other time delays of other circuit paths (not shown) of functional unit 103. As example, circuit 130 can be a critical path of potential longest time delay in comparisons with other circuit paths in functional unit 102.

As shown in FIG. 1A, each of circuits 110, 120, and 130 can include a node (e.g., supply node) coupled to node 107 to receive a voltage (e.g., supply voltage) V1. Circuits 110, 120, and 130 can use voltage V1 as a supply voltage (e.g., Vcc) for circuit elements (e.g., logic gates) in circuits 110, 120, and 130.

FIG. 1A shows circuits 110, 120, and 130 being located in separate functional units 101, 102, and 103 as an example. However, two or more (or all) of circuits 110, 120, and 130 can be located on the same functional unit. Further, FIG. 1A shows circuits 110, 120, and 130 being located in processing circuitry 105 of device 100 as an example. However, one or more or all of circuits 110, 120, and 130 can be located in another part of device 100 outside processing circuitry 105.

Processing circuitry 105 can operate at different frequencies at different times depending on the operating modes of processing circuitry 105. For example, processing circuitry 105 can operate at frequencies F1, F2, F3, and F4 (as indicated in FIG. 1A) at different times. FIG. 1A shows four frequencies F1, F2, F3, and F4 as an example. However, processing circuitry 105 can operate at less than or more than four frequencies.

Power controller 145 can operate to control (e.g., adjust) the value of voltage V1, the operating frequency of processing circuitry 105, or both, based on operating conditions and power demand of processing circuitry 105 during a particular operating mode of processing circuitry 105. Power controller 145 can employ a dynamic voltage and frequency scaling (DVFS) to perform power management in device 100. In some operating conditions of processing circuitry 105, power controller 145 can adjust the value of voltage V1 to be at a relatively low value (e.g., a minimum voltage value $V_{MIN}$, in volt units) to save power. Minimum voltage value $V_{MIN}$ of voltage V1 can be a lowest a value at which circuits 110, 120, 130 can maintain their proper operations at particular target frequency (e.g., frequency F1, F2, F3, or F4).

Power controller 145 can determine minimum voltage value $V_{MIN}$ based on information (e.g., a code) $V_{CODE}$ provided by monitor circuitry 160. Power controller 145 can include firmware, software, or hardware, or a combination firmware, software, and hardware to perform at least a portion of the operations (e.g., functions) described herein. As described in more detail below, the operations of power controller 145 can include providing control information (e.g., information CTLN, S1, S2, and S3) to (frequency) monitor circuitry 160 to cause monitoring circuit 160 to perform operations associated with generation of information $V_{CODE}$. The operations of power controller 145 can also include adjust the value of supply voltage (e.g., voltage V1) of circuits (e.g., circuits 110, 120, and 130) in processing circuitry 105 based on information $V_{CODE}$. Additional operations of power controller 145 can include analyzing values of $V_{CODE}$ over time to determine aging of circuit elements (e.g., transistors of processing circuitry 105) in device 100. Other operations of power controller 145 can include storing values of $V_{CODE}$ over time for purposes of determining aging of circuit elements in device 100 or other purposes (e.g., other power management actions based on information $V_{CODE}$).

Monitor circuitry 160 can perform a code generation operation (to generate information $V_{CODE}$) at a time interval that can be independent of the operation of processing circuitry 105 (e.g., performed in the background). Thus, the period for adjusting (e.g., updating) voltage V1 based on information $V_{CODE}$ can be flexible. Information $V_{CODE}$ can be analog or digital information. Monitor circuitry 160 can receive control information (e.g., information CTLN, S1, S2, and S3) from power controller 145 or from other part of device 100 (e.g., from processing circuitry 105) as part of code generation operation. As described in more detail below, monitor circuitry 160 can include replicas of circuits 110, 120, and 130. During a code generation operation, monitor circuitry 160 can selectively check (e.g., test) the replicas to generate information $V_{CODE}$, which can be used to adjust the supply voltage (e.g., voltage V1) of circuits 110, 120, and 130.

FIG. 1B, FIG. 1C, and FIG. 1D show more details of circuits 110, 120, and 130 of FIG. 1A according to some embodiments described herein. As shown in FIG. 1B, logic gates 118 and 119 can include transistors T1 and T2, respectively. Each of transistors T1 and T2 can include a non-gate terminal (e.g., a source terminal or a drain terminal) coupled to node 107 to receive voltage V1. For simplicity, other circuit elements (e.g., other transistors) of logic gates 118 and 119 are not shown in FIG. 1B.

As shown in FIG. 1C, logic gates 128 and 129 of circuit 120 can include transistors T3 and T4, respectively. Each of transistors T3 and T4 can include a non-gate terminal (e.g., a source terminal or a drain terminal) coupled to node 107 to receive voltage V1. For simplicity, other circuit elements (e.g., other transistors) of logic gates 128 and 129 are not shown in FIG. 1C.

As shown in FIG. 1D, logic gates 138 and 139 of circuit 130 can include transistors T5 and T6, respectively. Each of transistors T5 and T6 can include a non-gate terminal (e.g., a source terminal or a drain terminal) coupled to node 107 to receive voltage V1. For simplicity, other circuit elements (e.g., other transistors) of logic gates 138 and 139 are not shown in FIG. 1C.

Figure 2A:
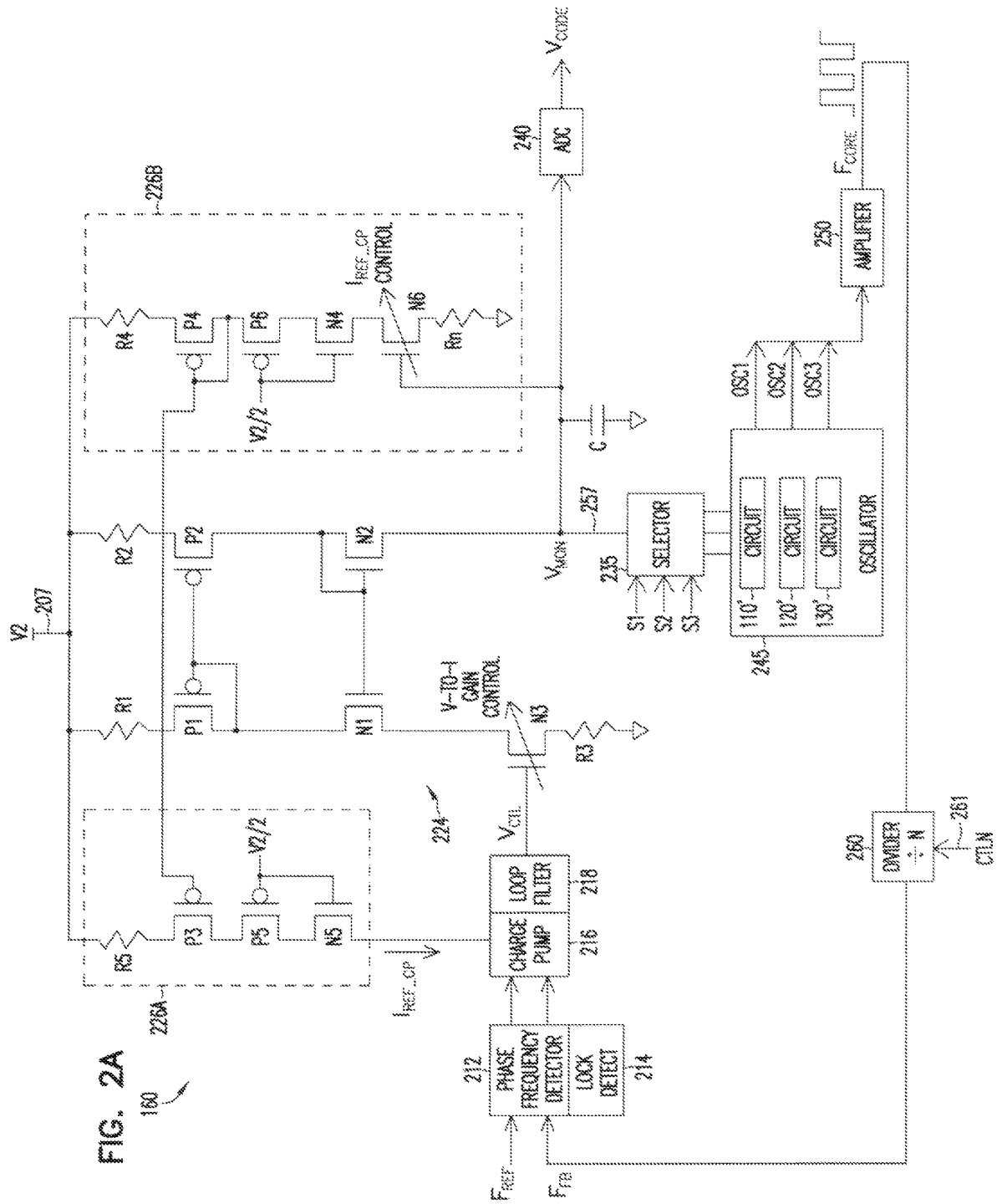
FIG. 2A shows the monitor circuitry of the device of FIG. 1A including a phase locked loop structure, according to some embodiments described herein.

FIG. 2A shows a schematic diagram of monitor circuitry 160 of FIG. 1A, according to some embodiments described herein. As shown in FIG. 2A, monitor circuitry 160 can include phase frequency detector 212, a lock detect circuit 214, a charge pump 216, a loop filter 218, a circuit including circuit portions (or circuits) 224, 226A and 226B, a selector (e.g., multiplexor) 235, and analog-to-digital converter (ADC) 240, an oscillator 245, an amplifier 250, a frequency divider 260. Monitor circuitry 160 can include a node (e.g., supply node) 207 to receive a voltage (e.g., supply voltage) V2. The value of voltage V2 can be greater (80% greater) than the value voltage V1 of FIG. 1A. Frequency divider 260 can be integer-N divider or fractional-N divider, such that value of variable (e.g., ratio) N in monitor circuitry 160 can be an integer or a non-integer.

Part of the structure of monitor circuitry 160 shown in FIG. 2A can be similar to a structure of a PLL. For example, phase frequency detector 212, lock detect circuit 214, charge pump 216, loop filter 218, and circuits 224, 226A and 226B can be part of a circuit path of the PLL (e.g., a PLL forward path) of monitor circuitry 160. Frequency divider 260 can be part of another circuit path of the PLL (e.g., PLL feedback path) of monitor circuitry 160.

Part of the operation of monitor circuitry 160 can be similar to the operation of a PLL. For example, phase frequency detector 212, lock detect circuit 214, a charge pump 216, and loop filter 218 can have operations similar to that of the same components in a PLL. In general, phase frequency detector 212 can receive signals $F_{REF}$ and $F_{FB}$ at its input nodes (not labeled) and compare the phases and frequencies of a signal $F_{REF}$ (e.g., reference signal) and a signal (e.g., feedback signal) $F_{FB}$ and provide the comparison result to charge pump 216. Charge pump 216 and loop filter 218 can operate to control (e.g., increase or decrease) the value (e.g., voltage value) of control information $V_{CTL}$. FIG. 2A shows "V-to-I gain control" (voltage to current gain control) at transistor N3 to indicate that monitor circuitry 160 can use control information $V_{CTL}$ to control the gain (e.g., voltage-to-current gain) of the PLL loop of monitor circuitry 160. The "V-to-I gain control" can tune either the transistor multiplier of transistor N3 or the resistance of resistor R3 to adjust how much additional drain current output of transistor N2 per $V_{CTL}$ change. When the PLL is locked (determined by lock detect circuit 214) voltage (e.g., monitored voltage) $V_{MON}$ is settled and stable (e.g., constant) for a given frequency of signal $F_{CORE}$.

Figure 2B:
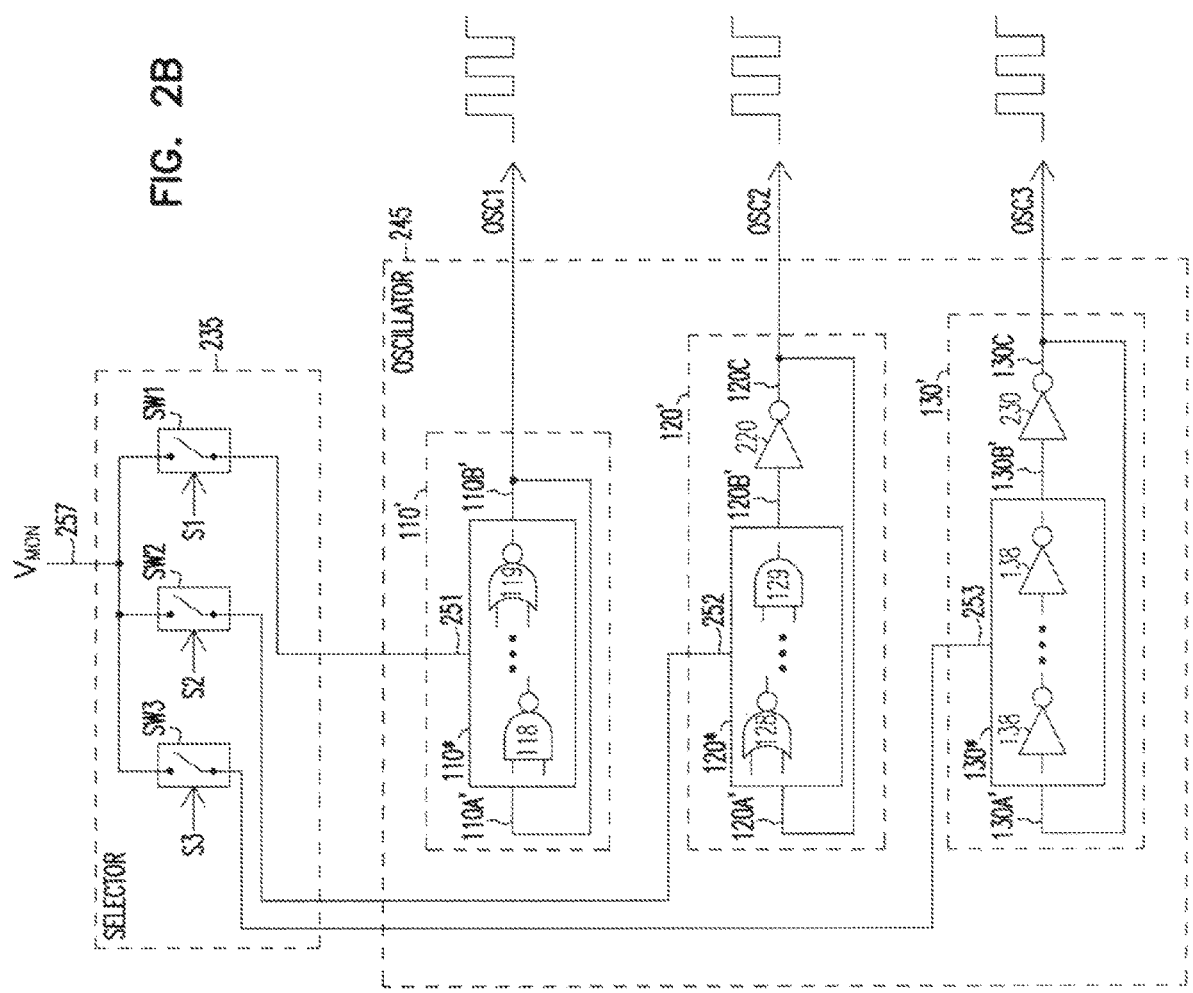
FIG. 2B shows details of a portion of the monitor circuitry including a selector, and an oscillator having replicas of the circuits of the processing circuitry of the device of FIG. 1A, according to some embodiments described herein.

As shown in FIG. 2A, oscillator 245 can include circuits 110', 120' and 130', which include replicas of circuits 110, 120, and 130, respectively. FIG. 2B shows more details of circuits 110', 120', and 130'. During operations of monitor circuitry 160 in FIG. 2A, oscillator 245 can generate signals OSC1, 0S2, and OSC3 one at time, depending on which replica of circuits 110, 120, and 130 of FIG. 1A (which of circuits 110', 120', and 130' in FIG. 2A) is selected at that time. Amplifier 250 can operate to amplify the signal (e.g., one of signals OSC1, OSC2, and OSC3) at the input node (not labeled) of amplifier 250 to provide signal $F_{CORE}$ at the output node (not labeled) of amplifier 250. The frequency of signal $F_{CORE}$ is the same as the frequency of signals OSC1, OSC2, and OSC3.

ADC 240 can operate to sense (e.g., sample) a voltage that ranges from near zero (e.g., 20 mV) to the supply voltage of ADC 240. For example, ADC 240 can sense the value of voltage $V_{MON}$ at a node (e.g., a circuit node) 257 and generate information $V_{CODE}$ having a value (e.g., time average value) in digital form (e.g., a number of binary bits) with a relatively small voltage resolution (e.g., 1.0 mV).

In FIG. 1A, signal $F_{REF}$ has known frequency and can be relatively stable. For example, signal $F_{REF}$ can be provided to device 100 (FIG. 1A) from a relatively stable signal generator (e.g., crystal oscillator). Signal $F_{FB}$ is generated by frequency divider 260 based on signal $F_{CORE}$. The frequency of signal $F_{FB}$ is the frequency of signal $F_{CORE}$ divided by variable N. Signal $F_{CORE}$ can have different frequencies at different time intervals based on different target frequencies (e.g., frequencies F1, F2, F3, and F4 in FIG. 1A). As described below, different frequencies of signal $F_{CORE}$ can be selected by selecting (e.g., changing) the value of variable N.

Frequency divider 260 can be programmable such that the value of variable N can be changed from one value to another value. As shown in FIG. 2A, frequency divider 260 can include a control input node (or input nodes) 261 to receive control information CTLN. Information CTLN can be analog or digital information and can be provided by power controller 145.

In FIG. 2A, unlike a conventional PLL, monitor circuitry 160 may not provide signal $F_{CORE}$ as a timing signal (e.g., clock signal) to another part (e.g., to a clock tree or a clock distribution circuitry) of device 100. Rather, monitor circuitry 160 may use signal $F_{CORE}$ as part of the code generation operation to generate information $V_{CODE}$, which can be used to as part of power management (e.g., to adjust the value of voltage V1). Information $V_{CORE}$ can be used to establish a real-time, worst case (among the candidates) correlation of a minimum voltage (e.g., $V_{MIN}$) and frequency (e.g., $V_{MIN}$-$F_{CORE}$ correlation). Directly checking the candidates (e.g., circuits 110, 120, and 130 in FIG. 1A), as discussed here, to generate information $V_{CORE}$ may be infeasible. However, including replicas of such candidates (e.g., circuits 110', 120', and 130' in FIG. 2B) in monitor circuitry 160 can provides relatively compact circuitry and feasible way to generate information $V_{CODE}$ based on checking (e.g., testing) of the replicas. Then, the results (e.g., information $V_{CORE}$) can be applied to the actual candidates because the replicas and the candidates have the same structures.

As shown in FIG. 2A, circuit 224 can include resistors R1, R2, and R3, a capacitor C, transistors (e.g., P-channel transistors) P1 and P2, and transistors (e.g., N-channel transistors) N1 and N2. Transistors P1 and P2 that can form a current mirror (e.g., P-current mirror). Transistors N1 and N2 can form another current mirror (e.g., N-current mirror). These interlocked current mirrors (e.g., P-current mirror and N-current mirror) and transistor N3 can operate to control the values of voltage $V_{MON}$ based on the value of control information $V_{CTL}$. Circuit 224 can enable voltage $V_{MON}$ to reach a particular voltage (e.g., 1V or higher) for a relatively high frequency (e.g., in the gigahertz range) of signal $F_{CORE}$. Circuit 224 can also enable control of supply noise rejection or supply voltage insensitivity of voltage V2 (which is a relatively high voltage). The structure of circuit 224 can allow monitor circuitry 160 to omit an additional voltage regulator in monitor circuitry 160. Circuit 224 can also enable loop gain adjustment and can be modeled as part of the voltage-controlled oscillator (VCO) gain of the PLL of monitor circuitry 160. The value of voltage V2 can be high enough as long as sufficient voltage headroom ensures transistors P1, P2, N1, N2, and N3 are in saturation.

Monitor circuitry 160 can be configured to allow a sweep of a wide range of values of variable N across each of the replicas (e.g., circuits 110', 120', and 130') in oscillator 245. The combination of circuits 226A and 226B can operate to self-maintain the bandwidth (natural frequency) and stability (damping factor) of the PLL operation of monitor circuitry 160 when the value of variable N changes. As shown in FIG. 2A, the combination of circuits 226A and 226B can include transistors P3, P4, P5, P6, N4, and N6, resistors R4, R5, and Rn. Circuits 226A and 226B can operate to source voltage $V_{MON}$ and to promptly generate a current (e.g., charge pump bias current) $I_{REF\_CP}$. The higher the value of voltage $V_{MON}$, the higher the frequency of signal $F_{CORE}$, and higher the value of current $I_{REF\_CP}$. FIG. 2A shows "$I_{REF\_CP}$ control" operation at transistor N6 to indicate that in monitor circuitry 160, the value of current $I_{REF\_CP}$ (provided to charge pump 216) can be based on a value of $V_{MON}$ at node 257. Resistor (e.g., degeneration resistor) $R_n$ can be used to improve linearity of current $I_{REF\_CP}$ versus voltage $V_{MON}$. The combination of circuits 226A and 226B can make both the PLL's natural frequency and damping factor (shown in equation (1) and (2), respectively, below).

$$\omega_n = \sqrt{\frac{I_{CP}K_{VCO}}{2\pi NC_1}} \quad (1)$$

$$\zeta = \frac{R_1}{2}\sqrt{\frac{I_{CP}C_1K_{VCO}}{2\pi N}} \quad (2)$$

nearly invariant, because current $I_{CP}$ tracks $T_{REF\_CP}$ which scales with N. In equations (1) and (2), $K_{VCO}$ is the gain of VCO in rad/s/Hz, $C_1$ and $R_1$ are the values of the conventional R-C loop filter. The gates of transistors P5 and P6 can be controlled by voltage V2/2 for electrical overstress (EOS) protection of relatively thin gate structures of the transistors (e.g., transistors P5, P6, N4, and N5) of circuits 226A and 226B.

Some conventional PLL structures may include an op-amp as part of generation of current $T_{REF\_CP}$. However, the structure of monitor circuitry 160 includes no op-amp in the circuitry portion that generate current $T_{REF\_CP}$. Thus, monitor circuitry 160 can have a relatively shorter time to settle the PLL loop (reflected on PLL lock time) and relatively more efficient (e.g., more current saving).

FIG. 2B shows details of a portion of monitor circuitry 160 including selector 235 and oscillator 245 having replicas of circuits 110, 120, and 130 of FIG. 1A, according to some embodiments described herein. As shown in FIG. 2B, circuit 110' can include a circuit portion 110* coupled between a node 110A' and a node 110B'. Node 110A' and 110B' can be input and output nodes, respectively, of circuit 110'. Node 110B' can be coupled to node 110A' through a conductive connection 211. As shown in FIG. 2B, circuit 110' can generate a signal OSC1 at node 110B'. Signal OSC1 is an oscillating signal during operation of monitor circuitry 160.

Circuit portion 110* can be a replica of circuit 110 of FIG. 1A, and nodes 110A', 110B', and 251 (FIG. 2B) can correspond to nodes 110A, 110B, and 107, respectively, of circuit 110 FIG. 1A. For example, circuit portion 110* include logic gates 118 and 119, which are the same as logic gates 118 and 119 of circuit 110 in FIG. 1A. Node 251 of circuit portion 110* can be coupled to a non-gate terminal of at least one transistor of circuit portion 110* (e.g., transistors T1 and T2 included in circuit portion 110*). The connection (not shown in detail) of logic gates 118 and 119 (and other circuit elements, not shown) in circuit portion 110* is the same as the connection of logic gates 118 and 119 (and other circuit elements, not shown) of circuit 110. Like circuit 110', circuits 120' and 130' can also replicas of circuits 120 and 130, respectively.

As shown in FIG. 2B, circuit 120' can include a circuit portion 120* coupled between a node 120A' and a node 120B', and an inverter 220 coupled in series with circuit portion 120* between node 120B' and a node 120C. Node 120A' and 120C can be input and output nodes, respectively, of circuit 120'. Node 120C can be coupled to node 120A' through a conductive connection 221. As shown in FIG. 2B, circuit 120' can generate a signal OSC2 at node 120C. Signal OSC2 is an oscillating signal during operation of monitor circuitry 160. The reason for inverter 220 to be added to circuit portion 120* (which is the replica of circuit 120 of FIG. 1A) is discussed below after the description of circuit 130.

Circuit portion 120* can be a replica of circuit 120 of FIG. 1A, and nodes 120A', 120B', and 252, respectively, of circuit 120' can correspond to nodes 120A, 120B, and 107, respectively, of circuit 120 of FIG. 1A. For example, circuit portion 120* include logic gates 128 and 129, which are the same as logic gates 128 and 129 of circuit 120 in FIG. 1A. Node 252 of circuit portion 120* can be coupled to a non-gate terminal of at least one transistor of circuit portion 120* (e.g., transistors T3 and T4 included in circuit portion 120*). The connection (not shown in detail) of logic gates 128 and 129 (and other circuit elements, not shown) in circuit portion 120* is the same as the connection of logic gates 128 and 129 (and other circuit elements, not shown) of circuit 120.

As shown in FIG. 2B, circuit 130' can include a circuit portion 130* coupled between a node 130A' and a node 130B', an inverter 230 coupled in series with circuit portion 130* between node 130B' and a node 130C. Node 130A' and 130C can be input and output nodes, respectively, of circuit 130'. Node 130C (e.g., output node of circuit 130') can be coupled to node 130A' (e.g., input node of circuit 130') through a conductive connection 231. As shown in FIG. 2B, circuit 130' can generate a signal OSC3 at node 130C. Signal OSC3 is an oscillating signal during operation of monitor circuitry 160.

Circuit portion 130* of circuit 130' can be a replica of circuit 130 of FIG. 1A, and nodes 130A', 130B', and 253 can correspond to nodes 130A, 130B, and 107, respectively, of circuit 130 of FIG. 1A. For example, circuit portion 130* include logic gates 138 and 139, which are the same as logic gates 138 and 139 of circuit 130 in FIG. 1A. Node 251 of circuit portion 130* can be coupled to a non-gate terminal of at least one transistor of circuit portion 130* (e.g., transistors T5 and T6 included in circuit portion 130*). The connection (not shown in detail) of logic gates 138 and 139 (and other circuit elements, not shown) in circuit portion 130* is the same as the connection of logic gates 138 and 139 (and other circuit elements, not shown) of circuit 130.

In oscillator 245, inverter 220 is included in circuit 120' because circuit portion 120* (which is the replica of circuit 120) may not provide an oscillating signal without inverter 220. For example, signal OSC2 may not be an oscillating signal without inverter 220. Similarly, inverter 230 is included circuit 130' because circuit portion 130* (which is the replica of circuit 130) may not provide an oscillating signal without inverter 220. For example, signal OSC3 may not be an oscillating signal without inverter 230. Circuit 110' does not include an inverter (e.g., like inverter 220 or 230) because circuit portion 110* can provide an oscillating signal. For example, signal OSC1 is an oscillating signal without an inverter coupled to the output node of circuit portion 110*. Thus, in oscillator 245, an inverter (e.g., inverter 220) can be added (e.g., coupled in series with) a replica of a particular circuit (e.g. circuit 120) of processing circuitry 105 of that particular circuit provide a non-inverting signal. In contrast, an inverter may not be added to a replica of a particular circuit (e.g. circuit 110) of processing circuitry 105 if that particular circuit can provide an inverting signal. The inverter (e.g., inverter 220 or 230) can be properly structured (e.g., sized) to contribute insignificant delay fraction relative to the critical path itself (or alternatively, the voltage guard band can be modified to reflect the addition of the inverter.)

FIG. 2B shows oscillator 245 including three circuits 110', 120', and 130' as an example. However, the number of circuits of oscillator 245 can be different from three (e.g., more than three or less than three), depending the number candidates (e.g., similar to circuits 110, 120, and 130) in processing circuitry 105 that are selected to be part of determining minimum voltage value $V_{MIN}$ and transistor aging in processing circuitry 105.

As shown in FIG. 2B, selector 235 can include switches SW1, SW2, and SW3, each of which can include a terminal coupled to node 257 and a terminal coupled one of nodes 251, 252, and 253. Voltage $V_{MON}$ at node 257 can be used as supply voltage of circuits 110', 120', and 130'. During operation of device 100, the value of voltage $V_{MON}$ can be different from the value of voltage V1 (e.g., supply voltage of circuits 110, 120, and 130 of FIG. 1A).

Selector 235 can use information (e.g., control information) S1, S2, and S3 to control (e.g., turn on or turn off) switches SW1, SW2, and SW3, respectively. Information S1, S2, and S3 can be analog information or digital information (binary bits) and can be provided by power controller 145. Each of switches SW1, SW2, and SW3 can be turn on for an on-time duration and turn for an off-time duration. The on-time and off-time durations can be controlled (e.g., predetermined) by power controller 145.

During operation of monitor circuitry 160, selector 235 can operate to selectively couple node 257 to nodes 251, 252, and 253 one at time. A circuit among circuits 110', 120', and 130' is selected when its supply node (e.g., node 251, 252, or 253) is coupled to node 257 through a corresponding switch (one of switches SW1, SW2, and SW3) that is turned-on. Only one of circuits 110', 120' and 130' can be selected a time to be tested during a code generation operation (performed by monitor circuitry 160) to provide information $V_{CODE}$. During a code generation operation, signal $F_{CORE}$ is one of signals OSC1, OSC2, and OSC3, depending on which circuit among circuits 110', 120', and 130' is selected. The value of information $V_{CODE}$ associated with testing of one circuit among circuits 110', 120', and 130' can be different from value of information $V_{CODE}$ associated with testing of another circuit among circuits 110', 120', and 130'.

The following description gives an example where monitor circuitry 160 performs a code generation operation to provide information $V_{CODE}$. In this example, frequency F1 is assumed to be the target frequency (e.g., the operating frequency of processing circuitry 105). Information $V_{CODE}$ provided by monitor circuitry 160 in this example can be used by power controller 150 to determine which value (e.g., minimum voltage value $V_{MIN}$) of voltage V1 (FIG. 1A) can be used in circuits 110, 120, and 130 to sustain frequency F1 (target frequency in this example).

In the example code generation operation (e.g., at the start of the code generation operation), power controller 145 can determine (e.g., calculate) the value for variable N (based on a given value of the target frequency), and then set the value for variable N at frequency divider 260. The value for variable N can be included in information CTLN (FIG. 2A). In FIG. 2A, the frequency of signal $F_{CORE}$ can be the product of the frequency of signal $F_{REF}$ and variable N (e.g., $F_{CORE}=F_{REF}*N$, where "*" indicates multiplication). Thus, if the target frequency of signal $F_{CORE}$ is frequency F1, then $F_{CORE}=F1=F_{REF}*N$. Therefore, $N=F1/F_{REF}$, where "/" indicates division. For example, if F1=2 GHz and $F_{REF}$=100 MHz, then N=2 GHz/100 Mhz=20. In this example, power controller 145 can set variable N to be 20.

Power controller 145 can control (e.g., activate) signals S1, S2, and S2 (e.g., after the value for variable N is set), such that only one switch among switches SW1, SW2, and SW3 can be turned on at any given time (while the other two switches among switches SW1, SW2, and SW3 are turned off). Thus, only one of circuits 110', 120', and 130' can be selected (e.g., activated) at a time.

In this example, power controller 145 can operate allow monitor circuitry 160 to regulate circuit 110' for a time interval (while circuits 120' and 130' are not selected (e.g., are decoupled from node 257). When the PLL in monitor circuitry is locked, the value of voltage $V_{MON}$ can represent the minimum voltage value $V_{MIN}$ that circuit 110' can sustain frequency F1 (which is the target frequency). ADC 240 can sample voltage $V_{MON}$ and converted into information $V_{CODE}$ (which is digital information) and provide it to power controller 145. Thus, the value of information $V_{CODE}$ during this code generation operation is based on PLL regulation of circuits 110'.

Monitor circuitry 160 can repeat the code generation operation for each of circuits 120' and 130' to generate information $V_{CODE}$ based on PLL regulation of circuits 120' and 130', respectively. Monitor circuitry 160 can use the same values of variable N, the same frequency F1 (target frequency), and same frequency for signal $F_{REF}$ in subsequent code generation operations. For example, in a next (e.g., second) code generation operation, power controller 145 can turn off switch SW1, turn on switch SW2, and turn off (or keep off) switch SW3. Thus, circuit 120' is selected (coupled to node 257) and circuits 110' and 130' are not selected (decoupled from node 257). When the PLL in monitor circuitry 160 is locked in this code generation operation, ADC 240 can sample voltage $V_{MON}$ and converted into information $V_{CODE}$ and provided to power controller 145. Thus, the value of information $V_{CODE}$ during this code generation operation is based on PLL regulation of circuits 120'.

In another (e.g., third) code generation operation, power controller 145 can turn off (or keep off) switch SW1, turn off switch SW2, and turn on switch SW3. Thus, circuit 130' is selected (coupled to node 257), and circuits 110' and 120' are not selected (decoupled from node 257). When the PLL in monitor circuitry 160 is locked in this code generation operation, ADC 240 can voltage $V_{MON}$ and converted into information $V_{CODE}$. Thus, the value of information $V_{CODE}$ during this code generation operation is based on PLL regulation of circuits 130'.

In the above example, information $V_{CODE}$ can have different values (e.g., digital values) from different code generation operations based on testing of circuits 110', 120', and 130'. Power controller 145 can select a value (among the different voltage values of information $V_{CODE}$) that corresponds to a highest voltage value. In this example, the selected value (highest voltage value) can be used as minimum voltage value $V_{MIN}$ for voltage V1 at frequency F1. Thus, the example code generation operation described herein can provide correlation of $V_{MIN}$-F1 (minimum voltage value $V_{MIN}$ at frequency F1).

The above example uses frequency F1 as a target frequency (e.g., $F_{CORE}$=F1) as an example. The same technique can be used for other target frequencies (e.g., frequency F2, F3, and F4). For example, if the target frequency is F2=3 GHz and $F_{REF}$=100 MHz, then N=F2/$F_{REF}$=3 GHz/100 MHz=30. In another example, if the target frequency is F3=4 GHz and $F_{REF}$=100 MHz, then N=F2/$F_{REF}$=4 GHz/100 MHz=40. In another example, if the target frequency is F4=6 GHz and $F_{REF}$=100 MHz, then N=F2/$F_{REF}$=6 GHz/100 MHz=60.

ADC 240 can operate to sense (e.g., sample) a voltage that ranges from near zero (e.g., 20 mV) to the supply voltage of ADC 240. During a code generation operation, ADC 240 can sense the value of voltage $V_{MON}$ at node 257 and generate a value (e.g., time average value) in digital form (e.g., a number of binary bits) with a relatively small voltage resolution (e.g., 1.0 mV). Information $V_{CODE}$ can include a number of bits that represent the value of voltage $V_{MON}$ sensed by ADC 240. Since monitor circuitry 160 has three circuits 110, 120, and 130 that are tested the code generation operation, ADC can generate information $V_{CODE}$ having three sets of values (digital values) corresponding testing to associated with circuits 110, 120, and 130. Each of the three set of values can include different value of information $V_{CODE}$.

FIG. 2C, FIG. 2D, and FIG. 2E show more details of circuits 110', 120', and 130' of FIG. 2B, according to some embodiments described herein. As described above, circuits 110', 120', and 130' include replicas of circuits 110, 120, and 130, respectively (FIG. 1A, FIG. 1B, FIG. 1C, and FIG. 1D). Thus, transistors T1, T2, T3, T4, T5, and T6 in FIG. FIG. 2C, FIG. 2D, and FIG. 2E are replicas of T1, T2, T3, T4, T5, and T6 of respective circuits 110', 120', and 130' (FIG. 1B, FIG. 1C, and FIG. 1D). As shown in FIG. 2C, FIG. 2D, and FIG. 2E, the non-gate terminal of each of transistors T1 and T2 can be coupled to node 251, the non-gate terminal of each of transistors T3 and T4 can be coupled to node 252, and the non-gate terminal of each of transistors T5 and T6 can be coupled to node 253. As described above with reference to FIG. 2B, nodes 251, 252, and 253 can be selectively coupled (e.g., coupled one at a time) to node 257 (which provide voltage $V_{MON}$) during a code generation operation of monitor circuitry 160.

In the above description, information $V_{CODE}$ can be used to adjust (e.g., dynamically adjust) the value of supply voltage $V_{ON}$ for a particular operating frequency of processing circuitry 105 (FIG. 1A). Information $V_{CODE}$ can also be used to determine (e.g., to track) aging of transistors (e.g., transistors T1 through T6 in FIG. 1A through FIG. 1D) in device 100. For example, some or all information $V_{CODE}$ generated by monitor circuitry 160 over a period can be collected (e.g., stored) for further analysis. Power controller 145 or another part of device 100 can be configured (e.g., configured by any combination of firmware, software, and hardware) to collect (e.g., store), analyze, or both, information $V_{CODE}$ generated by monitor circuitry 160.

The above description shows device 100 including monitor circuitry 160 that include a PLL structure for generating information $V_{CODE}$. However, device 100 can include a monitor circuitry that include a DLL structure for generating information $V_{CODE}$.

Figure 3A:
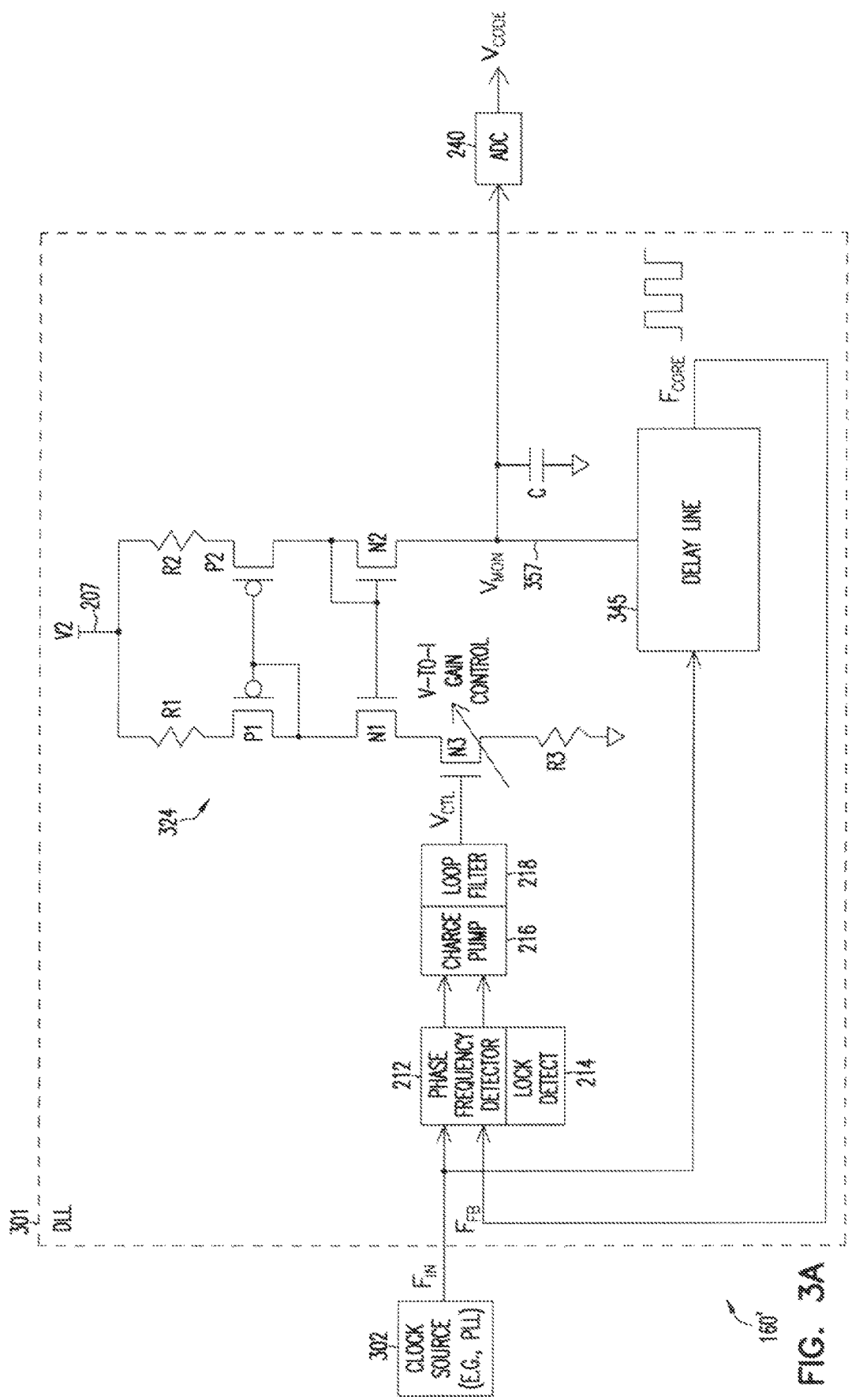
FIG. 3A shows monitor circuitry including a delay locked loop structure that can be a variation of the monitor circuitry of FIG. 2A, according to some embodiments described herein.

FIG. 3A shows monitor circuitry 160' including a DLL 301, according to some embodiments described herein. Monitor circuitry 160' can be included in device 100 of FIG. 1A as a variation of monitor circuitry 160. As shown in FIG. 3A, monitor circuitry 160' can provide information $V_{CODE}$, which can be used by power controller 145 to manage power consumption in device 100, as described above with reference to FIG. 1A through FIG. 2D. DLL 301 of FIG. 3A can include circuit elements that are similar or the same as the circuit element of monitor circuitry 160 of FIG. 1A and FIG. 2A. Thus, for simplicity, similar or identical elements between monitor circuitry 160 and monitor circuitry 160' are given the same labels and their descriptions are not repeated.

As shown in FIG. 3A, DLL 301 can include a circuit path that includes phase frequency detector 212, lock detect circuit 214, charge pump 216, loop filter 218, a circuit 324, and a node 357 to provide voltage $V_{MON}$. DLL 301 can include a delay line 345 coupled to node 357, and ADC 240 coupled to node 357. DLL 301 can include a circuit path (e.g., a feedback path) coupled between delay line 345 and an input node (not labeled) of phase frequency detector 212 to provide signal $F_{CORE}$ to phase frequency detector 212 as signal (e.g., feedback signal) $F_{FB}$.

DLL 301 can receive a signal (e.g., input signal) $F_{IN}$ at an input node (not labeled) of phase frequency detector 212. Signal $F_{IN}$ can be provided by a clock source 302, which can include a PLL. The frequency of signal $F_{IN}$ can be selected based on a target frequency that can have different values at different times. For example, the frequency of signal $F_{IN}$ can be selected based on frequencies F1, F2, F3, and F4 (FIG. 1A). Delay line 345 can receive signal $F_{IN}$ at an input node (not labeled) of delay line 345 and generate signal $F_{CORE}$ at an output node (not labeled) of delay line 345. The frequency of signal $F_{CORE}$ can be the same as the frequency of signal $F_{IN}$. The frequency of signal $F_{FB}$ can be the same as the frequency as signal $F_{CORE}$.

FIG. 3A shows "V-to-I gain control" (voltage to current gain control) at transistor N3, degenerated by R3, to indicate the voltage-to-current gain can be controlled by tuning transistor N3, or resistor R3 based on information $V_{CTL}$ provided by loop filter 218. Delay line 345 can include a replica of a circuit (e.g., a critical path) in device 100 that may have a longest time delay (e.g., maximum delay) among the time delays of other circuits (e.g., other critical paths) of device 100. For example, one of circuits 110, 120, and 130 of FIG. 1A may have (or may be deemed to have) a longest time delay among circuits (e.g., critical paths) of device. Thus, delay line 345 can include a circuit (among circuits 110, 120, and 130) that has a longest time delay among circuits 110, 120, and 130 of FIG. 1A.

Figure 3B:
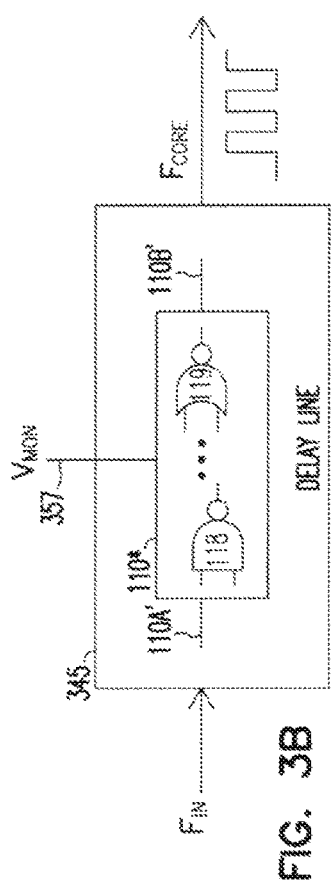
FIG. 3B, FIG. 3C, and FIG. 3D show examples of a delay line of the monitor circuitry of FIG. 3A having a replica of a circuit in the processing circuitry of the device of FIG. 1A, according to some embodiments described herein.
Figure 3C:
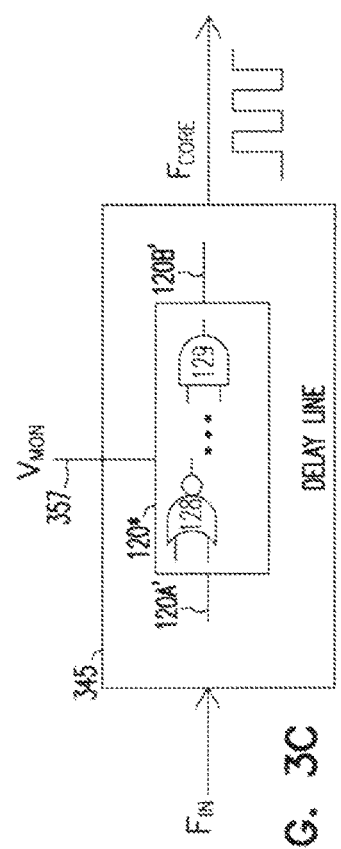
Figure 3D:
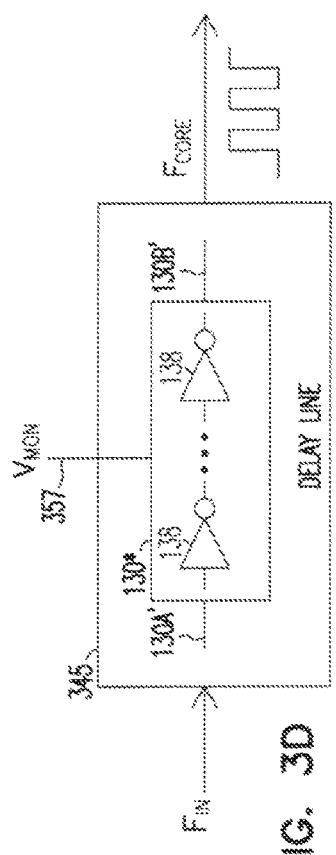

FIG. 3B, FIG. 3C, and FIG. 3D show examples where delay line 345 of DLL 301 (FIG. 3A) can include a replica of a circuit that may have (or may be deemed to have) a longest time delay among circuits 110, 120, 130 and other circuits (e.g., other critical paths) of device 100 (e.g., in processing circuitry 105 of FIG. 1A).

FIG. 3B shows an example where delay line 345 of DLL 301 can include a circuit (between nodes 110A' and 110B') that is a replica of circuit 110 of FIG. 1A. In this example, circuit 110 of FIG. 1A is deemed (e.g., assumed) to have a longest time delay among circuits 110, 120, and 130 (and among other critical paths) of device 100.

FIG. 3C shows another example where delay line 345 of DLL 301 (FIG. 3A) can include a circuit (between nodes 120A' and 120B') that is a replica of circuit 120 of FIG. 1A. In this example, circuit 120 of FIG. 1A is deemed (e.g., assumed) to have a longest time delay among circuits 110, 120, and 130 (and among other critical paths) of device 100.

FIG. 3D shows another example where delay line 345 of DLL 301 (FIG. 3A) can include a circuit (between nodes 130A' and 139B') that is a replica of circuit 130 of FIG. 1A. In this example, circuit 130 of FIG. 1A is deemed (e.g., assumed) to have a longest time delay among circuits 110, 120, and 130 (and among other critical paths) of device 100.

Figure 4A:
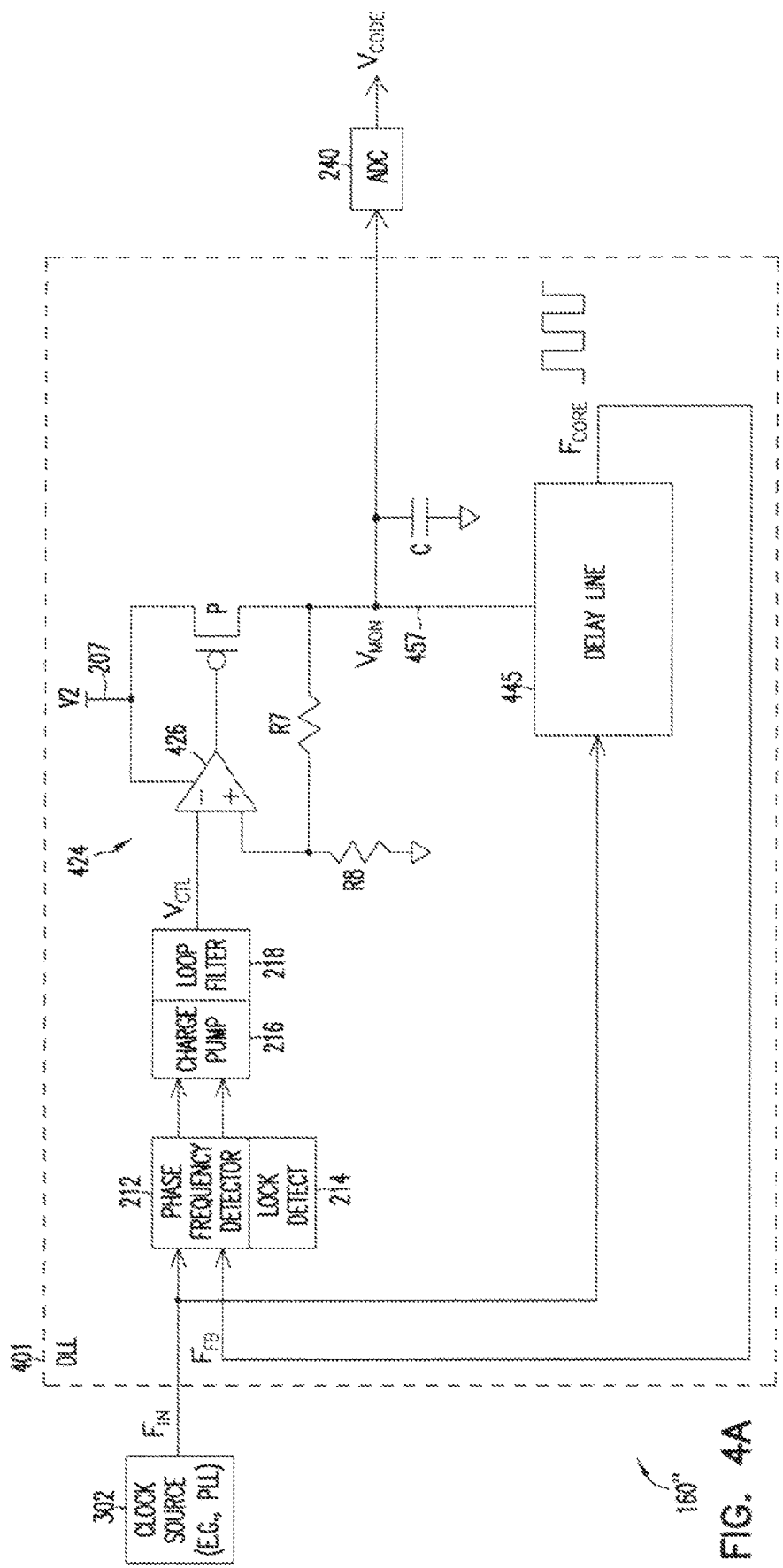
FIG. 4A shows another monitor circuitry including another delay locked loop structure that can be another variation of the monitor circuitry of FIG. 2A, according to some embodiments described herein.

FIG. 4A shows monitor circuitry 160" including a DLL 401, according to some embodiments described herein. Monitor circuitry 160" can be included device 100 of FIG. 1A as a variation of monitor circuitry 160. As shown in FIG. 4A, monitor circuitry 160" can provide information $V_{CODE}$, which can be used by power controller 145 to manage power consumption in device 100, as described above with reference to FIG. 1A through FIG. 2D. DLL 401 of FIG. 4A can include circuit elements that are similar or the same as the circuit element of monitor circuitry 160 (FIG. 1A and FIG. 2A) and monitor circuitry 160' (FIG. 3A). Thus, for simplicity, similar or identical elements between monitor circuitries 160, 160', and 160" are given the same labels and their descriptions are not repeated.

As shown in FIG. 4A, DLL 401 can include a circuit path that includes phase frequency detector 212, lock detect circuit 214, charge pump 216, loop filter 218, a circuit 424, and a node 457 to provide voltage $V_{MON}$. DLL 401 can include a delay line 445 coupled to node 457, and ADC 240 coupled to node 457. DLL 401 can include a circuit path (e.g., a feedback path) coupled between delay line 445 and input node (not labeled) of phase frequency detector 212 to provide signal $F_{CORE}$ to phase frequency detector 212 as signal (e.g., feedback signal) $F_{FB}$.

DLL 401 can receive a signal (e.g., input signal) $F_{IN}$ at an input node (not labeled) of phase frequency detector 212. Signal $F_{IN}$ can be provided by a clock source 302, which can include a PLL. The frequency of signal $F_{IN}$ can be selected based on a target frequency that can have different values at different times. For example, the frequency of signal $F_{IN}$ can be selected based on frequencies F1, F2, F3, and F4 (FIG. 1A). Delay line 445 can receive signal $F_{IN}$ at an input node (not labeled) of delay line 445 and generate signal $F_{CORE}$ at an output node (not labeled) of delay line 445. The frequency of signal $F_{CORE}$ can be the same as the frequency of signal $F_{IN}$. The frequency of signal $F_{FB}$ can be the same as the frequency as signal $F_{CORE}$.

As shown in FIG. 4A, DLL 401 can include a circuit 424 having an amplifier (e.g., an error amplifier) 426 coupled to a transistor P and resistors R7 and R8 to form a voltage regulator to regulate voltage $V_{MON}$. At steady state, the value of voltage $V_{MON}$ times R8/(R7+R8) should be virtually equal to the value of voltage $V_{CTL}$. Delay line 445 can include a replica of a circuit (e.g., a critical path) in device 100 that may have a longest time delay (e.g., maximum delay) among the time delays of other circuits (e.g., other critical paths) of device 100. For example, one of circuits 110, 120, and 130 of FIG. 1A may have (or may be deemed to have) a longest time delay among circuits (e.g., critical paths) of device. Thus, delay line 445 can include a circuit (among circuits 110, 120, and 130) that has a longest time delay among circuits 110, 120, and 130 of FIG. 1A.

Figure 4B:
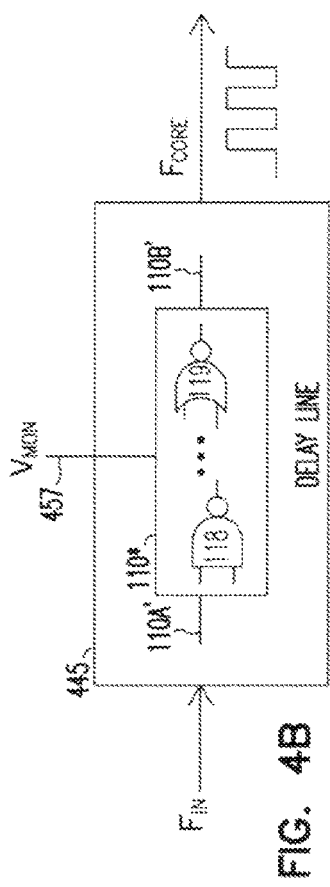
FIG. 4B, FIG. 4C, and FIG. 4D show examples of a delay line of the monitor circuitry of FIG. 4A having a replica of a circuit in the processing circuitry of the device of FIG. 1A, according to some embodiments described herein.
Figure 4C:
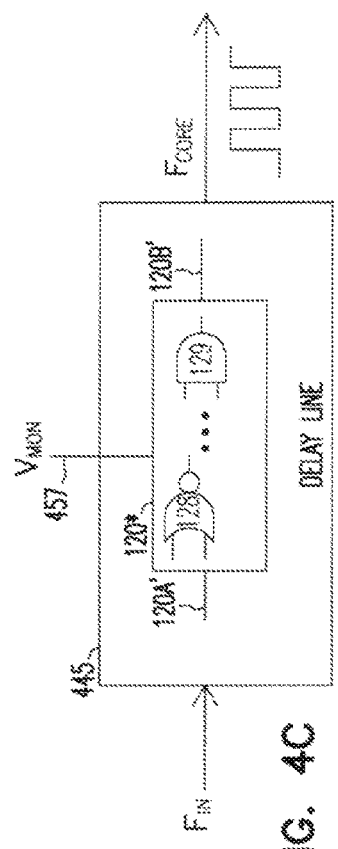
Figure 4D:
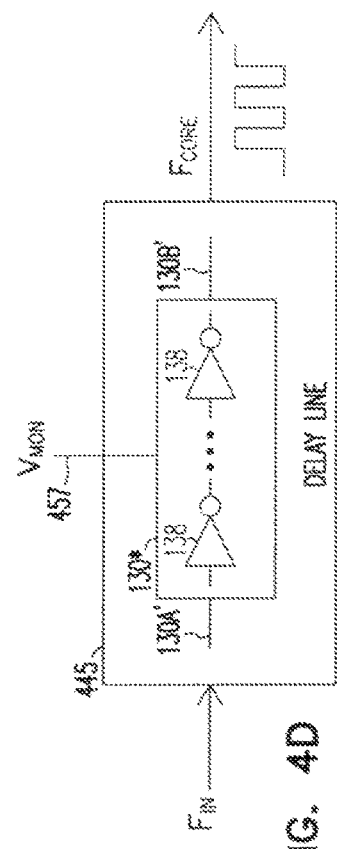

FIG. 4B, FIG. 4C, and FIG. 4D show examples where delay line 445 of DLL 401 (FIG. 4A) can include a replica of a circuit that may have (or may be deemed to have) a longest time delay among circuits 110, 120, 130 and other circuits (e.g., other critical paths) of device 100 (e.g., in processing circuitry 105 of FIG. 1A).

FIG. 4B shows an example where delay line 445 of DLL 401 can include a circuit (between nodes 110A' and 110B') that is a replica of circuit 110 of FIG. 1A. In this example, circuit 110 of FIG. 1A is deemed (e.g., assumed) to have a longest time delay among circuits 110, 120, and 130 (and among other critical paths) of device 100.

FIG. 4C shows another example where delay line 445 of DLL 401 (FIG. 4A) can include a circuit (between nodes 120A' and 120B') that is a replica of circuit 120 of FIG. 1A. In this example, circuit 120 of FIG. 1A is deemed (e.g., assumed) to have a longest time delay among circuits 110, 120, and 130 (and among other critical paths) of device 100.

FIG. 4D shows another example where delay line 445 of DLL 401 (FIG. 4A) can include a circuit (between nodes 130A' and 130B') that is a replica of circuit 130 of FIG. 1A. In this example, circuit 130 of FIG. 1A is deemed (e.g., assumed) to have a longest time delay among circuits 110, 120, and 130 (and among other critical paths) of device 100.

In the above description with FIG. 3A and FIG. 4A, specific structures of DLL 301 and DLL 401 are used as example. However, DLL 301 or DLL 401 can have a different DLL structure as long as the DLL can include a replica of a circuit path (e.g., critical path) of a device (e.g., device 100) that includes the DLL.

The techniques described herein can have improvements and benefits over some conventional techniques. For examples, in some conventional techniques, determining minimum voltage value $V_{MIN}$ for a set of core operating frequencies can be resource constrained and time consuming and in high volume manufacturing, thereby limiting the raw $V_{MIN}$-$F_{CORE}$ correlations. This can result in inaccuracies, uncertainties, or both, in the frequency-voltage curves between tested frequencies. Thus, some conventional techniques add guard band for minimum voltage value across all devices. This makes final minimum voltage value $V_{MIN}$ aggressively high for at least some of the devices. Conventional techniques of one-time generated $V_{MIN}$-$F_{CORE}$ curve can maintain the reliability of the device. However, such one-time generated $V_{MIN}$-$F_{CORE}$ curve is prone to more transistor aging and more power consumption than necessary, particularly in some high-power modes of the device due to elevated supply voltage needed for such higher power modes.

In contrast, the techniques described herein can determine minimum voltage value $V_{MIN}$ in real-time by generating information $V_{CODE}$ (as described above) during actual operations of each device (e.g., device 100). Thus, the $V_{MIN}$-$F_{CORE}$ correlation for a specific frequency (e.g., frequency F1, F2, F3, of F4 described above) based on the techniques described herein can be determined more accurately in comparison with some conventional techniques. This can lead to more efficiency in power management in the device (e.g., device 100) described herein in comparison with that of some conventional techniques.

Moreover, some conventional techniques as discussed above lack regular (e.g., real-time) updated values for $V_{MIN}$-$F_{CORE}$ correlation for the device. Thus, countering the effect of aging using conventional techniques can be difficult. In contrast, in the techniques described herein, the information (e.g., information $V_{CODE}$) that can be used (e.g., used as aging sensor) for gauging, modelling, or both, aging of critical paths in the device (e.g., device 100) can be regularly generated and updated in real time. Thus, in comparison with some conventional techniques, this real-time aging information (e.g., based on information $V_{CODE}$) described herein can be more accurate in determining $V_{MIN}$-$F_{CORE}$ correlation in the long term in when solutions to counter the effect of aging in the device (e.g., device 100) is considered.

Figure 5:
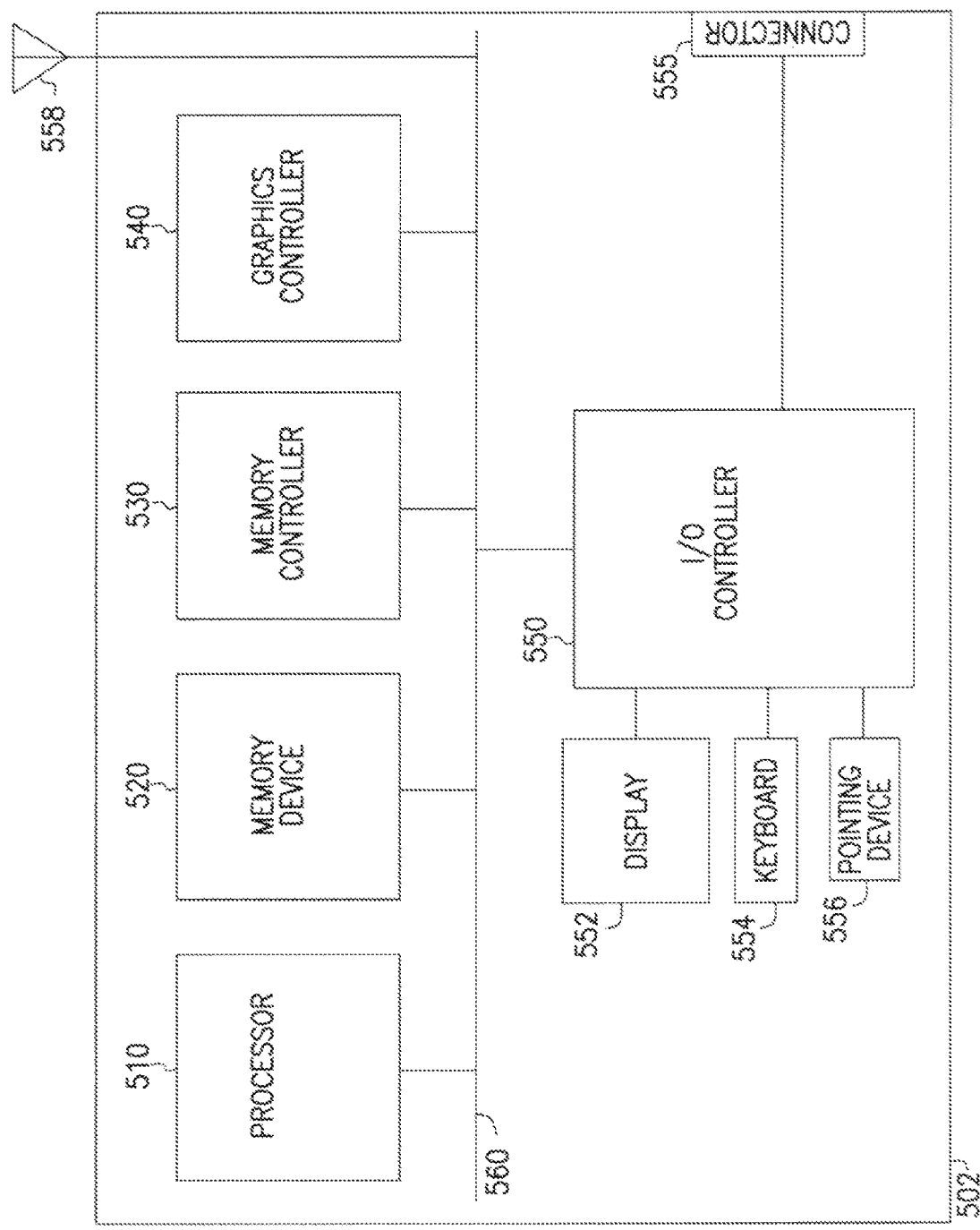
FIG. 5 shows an apparatus in the form of a system (e.g., electronic system), according to some embodiments described herein.

FIG. 5 shows an apparatus in the form of a system (e.g., electronic system) 500, according to some embodiments described herein. System 500 can include or be included in a computer (e.g., desktop or notebook computer), a tablet, a cellular telephone, and other electronic devices or systems. As shown in FIG. 5, system 500 can include a processor 510, a memory device 520, a memory controller 530, a graphics controller 540, an input and output (I/O) controller 550, a display processing circuitry 552, a keyboard processing circuitry 554, a pointing device processing circuitry 556, at least one antenna 558, a connector 555, and a bus 560.

Processor 510 can a general-purpose processor or an application specific integrated circuit (ASIC), or other types of processors. Memory device 520 can include a DRAM device, an SRAM device, a flash memory device, a phase change memory, or a combination of these memory devices. Memory device 520 may include other types of memory. Display processing circuitry 552 can include a liquid crystal display (LCD), a touchscreen (e.g., capacitive or resistive touchscreen), or another type of display. Pointing device processing circuitry 556 can include a mouse, a stylus, or another type of pointing device.

I/O controller 550 can include a communication module for wired or wireless communication (e.g., communication through one or more antenna 558). Such wireless communication may include communication in accordance with WiFi communication technique, Long Term Evolution Advanced (LTE-A) communication technique, or other communication techniques.

I/O controller 550 can also include a module to allow system 500 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 555 can be arranged (e.g., can include terminals, such as pins) to allow system 500 to be coupled to an external device (or system). This may allow system 500 to communicate (e.g., exchange information) with such a device (or system) through connector 555.

Connector 555 and at least a portion of bus 560 can include conductive lines that conform with at least one of USB, DP, HDMI, Thunderbolt, PCIe, Ethernet, and other specifications.

FIG. 5 shows the components of system 500 arranged separately from each other as an example. In some arrangements, two or more components of system 500 can be located on the same die (e.g., same chip) that forms a system-on-chip (SoC).

In some embodiments, system 500 may not include one or more of the components shown in FIG. 5. For example, system 500 may not include at least one of display processing circuitry 552, keyboard processing circuitry 554, pointing device processing circuitry 556, antenna 558, connector 555, and other components shown in FIG. 5.

At least one of processor 510, memory device 520, memory controller 530, graphics controller 540, and I/O controller 550 can include a device 100 described above with reference to FIG. 1A through FIG. 4D. Thus, at least one of processor 510, memory device 520, memory controller 530, graphics controller 540, and I/O controller 550 can include monitor circuitry 160, 160', or 160" described above with reference to FIG. 1A through FIG. 4D.

The embodiments described may be implemented in one or a combination of hardware, firmware and software. Embodiments may also be implemented as instructions stored on a computer-readable storage medium, which may be read and executed by at least one processor to perform the operations and activities described herein. A computer-readable storage medium may include any non-transitory mechanism for storing information (e.g., instructions) in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors (e.g., processor 510) may be configured with the instructions to perform the operations and activities described herein.

The illustrations of apparatus (e.g., device 100 and system 500) and methods (e.g., the operations of device 100 and system 500) described above with reference to FIG. 1A through FIG. 5 are intended to provide a general understanding of the structure of various embodiments and are not intended to provide a complete description of all the elements and features of apparatuses that might make use of the structures described herein.

The apparatus (e.g., device 100 and system 500) and methods (e.g., the operations of device 100 and system 500) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g., circuit, electronic system, or both), or a machine) including a first path in a phase locked loop, the first path including a phase frequency detector to receive a first signal having a first frequency and a first node to provide a voltage, an oscillator coupled to a second node and the first node to provide a second signal having a second frequency at the second node, a second path including a frequency divider coupled to the second node and the phase frequency detector, and a circuit to generate digital information having a value based on a value of the voltage at the second node.

In Example 2, the subject matter of Example 1 may optionally include, wherein the digital information has a first value corresponding to a first value of the voltage at the second node, and a second value corresponding to a second value of the voltage at the second node.

In Example 3, the subject matter of Example 1 may optionally include, wherein the oscillator is configured to provide a third signal having a third frequency.

In Example 4, the subject matter of Example 1 may optionally include, wherein the first path includes a charge pump coupled to the phase frequency detector, and a filter coupled to the charge pump.

In Example 5, the subject matter of Example 4 may optionally include, wherein the charge pump includes a node to receive a current, the current having a value based on a value of the voltage at the first node.

In Example 6, the subject matter of Example 1 may optionally include further comprising a die and an additional circuit on the die, wherein the phase locked loop is located on the die, and wherein the additional circuit includes a logic gate coupled to a supply node of the additional circuit, and the oscillator includes a replica of the additional circuit, the replica of the additional circuit including a replica of the logic gate, the replica of the logic gate coupled to the second node.

Example 7 includes subject matter (such as a device, an electronic apparatus (e.g., circuit, electronic system, or both), or a machine) including a phase frequency detector to receive a first signal having a first frequency, a charge pump coupled to the phase frequency detector, a filter coupled to the charge pump, and a circuit coupled to the filter, the circuit including a circuit node to provide a voltage, a first circuit to generate a first oscillating signal, the first circuit including a first node, and a first additional node to provide the first oscillating signal, a second circuit to generate a second oscillating signal, the second circuit including a second node, and a second additional node to provide the second oscillating signal, a first switch coupled between the circuit node and the first node of the first circuit, a second switch coupled between the circuit node and the second node of the second circuit, a frequency divider coupled between the phase frequency detector and each of the first additional node and the second additional node, and an analog-to-digital converter coupled to circuit node.

In Example 8, the subject matter of Example 7 may optionally include, wherein each of the first and second switches includes a first terminal coupled to the circuit node, and wherein the first circuit includes a first transistor having a non-gate terminal coupled to a second terminal of the first switch, and the second circuit includes a second transistor having a non-gate terminal coupled to a second terminal of the second switch.

In Example 9, the subject matter of Example 7 may optionally include, further comprising a third circuit to generate a third oscillating signal, the third circuit including a third node, and a third additional node to provide the third oscillating signal, and a third switch coupled between the circuit node and the third node.

In Example 10, the subject matter of Example 7 may optionally include, further comprising a transistor having a gate coupled to the circuit node, and source and drain terminals coupled between a supply node and ground.

In Example 11, the subject matter of Example 10 may optionally include, further comprising a first additional transistor and a second additional transistor coupled in series with the first additional transistor between the charge pump and the supply node.

Example 12 includes subject matter (such as a device, an electronic apparatus (e.g., circuit, electronic system, or both), or a machine) including a first circuit on a die and a second circuit on the die, a phase frequency detector on a circuit path on the die to receive a first signal having a first frequency, the circuit path including a circuit node to provide a voltage, a first additional circuit on the die and coupled to the circuit node, the first additional circuit including replica of the first circuit, and a first output node to provide a first oscillating signal, a second additional circuit on the die and coupled to the circuit node, the second additional circuit including a replica of the second circuit, and a second output node to provide a second oscillating signal, a frequency divider coupled to the phase frequency detector and to each of the first and second output nodes, and an analog-to-digital converter coupled to circuit node.

In Example 13, the subject matter of Example 12 may optionally include, wherein each of the first and second additional circuits includes at least one logic gates.

In Example 14, the subject matter of Example 12 may optionally include, wherein the first circuit includes a first logic gate and a second logic gate coupled between a first node and a second node of the first circuit, and the first additional circuit includes a replica of the first logic gate and a replica of the second logic gate coupled between a first node and a second node of the first additional circuit.

In Example 15, the subject matter of Example 14 may optionally include, wherein the first additional circuit includes an inverter coupled between the second node of the first additional circuit and the first output node.

Example 16 includes subject matter (such as a device, an electronic apparatus (e.g., circuit, electronic system, or both), or a machine) including a first circuit on a die, and a delay locked loop including a first circuit path on the die, the first circuit path including a phase detector having a first input node to receive a first signal, and a circuit node to provide a voltage, a delay line included in the delay locked loop, the delay line including an input node to receive the first signal and an output node to provide a second signal having a frequency based on a frequency of the first signal, the delay line including a second circuit coupled to the circuit node, the second circuit including a replica of the first circuit, a second circuit path included in the delay locked loop and coupled between the delay line and a second input node of the phase frequency detector, and an analog-to-digital converter coupled to circuit node.

In Example 17, the subject matter of Example 16 may optionally include, wherein the first circuit includes a logic gate and the second circuit includes a replica of the logic gate.

In Example 18, the subject matter of Example 16 may optionally include, wherein the second circuit includes a transistor, the transistor having a non-gate terminal coupled to the circuit node.

Example 19 includes subject matter (such as a device, an electronic apparatus (e.g., circuit, electronic system, or both), or a machine) including a processor including a processing circuitry and a phase locked loop coupled to the processing circuitry, the processing circuitry including a logic circuit path, the phase locked loop including a first path including a phase frequency detector to receive a first signal having a first frequency and a first node to provide a voltage, an oscillator coupled to a second node and the first node to provide a second signal having a second frequency at the second node, a second path including a frequency divider coupled to the second node and the phase frequency detector, and an analog-to-digital converter coupled to the first node.

In Example 20, the subject matter of Example 19 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specification.

The subject matter of Example 1 through Example 20 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first circuit on a die; and
   a delay locked loop coupled to the first circuit, the delay locked loop including a first circuit path on the die, the first circuit path including a phase frequency detector having a first input node to receive a first signal, and a circuit node to provide a voltage based on a comparison between the first signal at the first input node of the phase frequency detector and a second signal at a second input node of the phase frequency detector;
   a delay line included in the delay locked loop, the delay line including an input node to receive the first signal and an output node to provide the second signal having a frequency based on a frequency of the first signal, the delay line including a second circuit coupled to the circuit node, the second circuit including a replica of the first circuit;
   a second circuit path included in the delay locked loop and coupled between the delay line and the second input node of the phase frequency detector; and
   an analog-to-digital converter coupled to the circuit node.

2. The apparatus of claim 1, wherein the first circuit includes a logic gate and the second circuit includes a replica of the logic gate.

3. The apparatus of claim 1, wherein the second circuit includes a transistor, the transistor having a non-gate terminal coupled to the circuit node.

4. The apparatus of claim 1, wherein the first path includes a charge pump coupled to the phase frequency detector.

5. The apparatus of claim 4, wherein the first path includes a filter coupled to the charge pump.

6. The apparatus of claim 5, wherein the first path includes a transistor having a gate coupled to an output of the filter.

7. The apparatus of claim 6, wherein the first path includes a first additional transistor coupled between the transistor and a supply node, and a second additional transistor coupled between the supply node and the circuit node.

8. The apparatus of claim 1, further comprising a third circuit path included in the delay locked loop, the third circuit including a current mirror coupled to the circuit node.

9. An apparatus comprising:
   a processor including a processing circuitry and a delay locked loop coupled to the processing circuitry, the processing circuitry including a logic circuit path, the logic circuit path including a first circuit coupled to the delay locked loop, the delay locked loop including:
   a first circuit path including a phase frequency detector having a first input node to receive a first signal, and a circuit node to provide a voltage based on a comparison between the first signal at the first input node of the phase frequency detector and a second signal at a second input node of the phase frequency detector;
   a delay line including an input node to receive the first signal and an output node to provide the second signal having a frequency based on a frequency of the first signal, the delay line including a second circuit coupled to the circuit node, the second circuit including a replica of the first circuit; and
   a second circuit path coupled between the delay line and the second input node of the phase frequency detector.

10. The apparatus of claim 9, further comprising an analog-to-digital converter coupled to the circuit node.

11. The apparatus of claim 9, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

* * * * *